United States Patent [19] [11] Patent Number: 4,591,509
Krevet et al. [45] Date of Patent: May 27, 1986

[54] PROCESS FOR THE PREPARATION OF SUPERCONDUCTING COMPOUND MATERIALS

[75] Inventors: Berthold Krevet, Dettenheim-Liedolsheim; Wolfgang Schauer, Pfinztal; Fritz Wüchner, Germersheim, all of Fed. Rep. of Germany

[73] Assignee: Kernforschungszentrum Karlsruhe GmbH, Fed. Rep. of Germany

[21] Appl. No.: 627,940

[22] Filed: Jul. 5, 1984

Related U.S. Application Data

[60] Continuation of Ser. No. 432,377, Sep. 30, 1982, abandoned, which is a division of Ser. No. 246,050, Mar. 20, 1980, Pat. No. 4,386,115.

[30] Foreign Application Priority Data

Mar. 27, 1980 [EP] European Pat. Off. ......... 80101648.6

[51] Int. Cl.[4] .............................................. B05D 5/12
[52] U.S. Cl. .................................. 427/62; 427/248.1; 427/250; 427/255; 427/255.4; 427/255.7; 427/404; 427/419.2
[58] Field of Search ................. 427/62, 63, 248.1, 250, 427/255, 255.4, 255.7, 404, 419.2

[56] References Cited

U.S. PATENT DOCUMENTS

| | | | |
|---|---|---|---|
| 4,128,121 | 12/1978 | Sigsbee | 427/250 |
| 4,129,166 | 12/1978 | Sigsbee | 427/62 |
| 4,129,167 | 12/1978 | Sigsbee | 427/62 |
| 4,295,147 | 10/1981 | Kircher et al. | 427/62 |

FOREIGN PATENT DOCUMENTS 716018  8/1965  Canada .................................. 427/63

OTHER PUBLICATIONS

Applied Physics Letters, vol. 33, Jul.-Dec. 1978, pp. 359-361, (Gavaler et al).
Philosophical Magazine, vol. 37, Jan.-Jun. 1978, pp. 713-730.
Vlasov, Sov. Phys. Crystallage 24(b) Nov.-Dec. 1979, pp. 744-745.
Ames, IBM J. Res. Develop., vol. 24, No. 2, Mar. 1980, pp. 188-194.
Ronay, IBM Tech. Dis. Bal., vol. 22, No. 1, Jun. 1979, pp. 411-412.
Feuer et al, American Inst. Physics. Conf. Proc. No. 44, pp. 317-321.
Alessandrini et al, J. Vac. Sci. Tech. 15(2), Mar.-Apr. 1978, pp. 377-381.
Fujimaki et al, J. Appl. Phys. 52(2), Feb. 1981, pp. 912-914.
Chi et al, Thin Solid Films 72, 1980, pp. 285-290.
Reale, Physics Letters 57A(1), May 17, 1976, pp. 65-66.
Lahiri, IBM Tech, Dis. Bul., vol. 22, No. 7, Dec. 1979, p. 2938.

Primary Examiner—Richard Bueker
Attorney, Agent, or Firm—Sughrue, Mion, Zinn, Macpeak, and Seas

[57] ABSTRACT

A process for the preparation of a compound material composed of a substrate and a metallic layer of a metastable or unstable phase strongly adhering to the substrate surface. This phase contains more than one elemental component, and is deposited onto the substrate from the gas or vapor phase. In this process:

(a) the components used for formation of the metastable or unstable phase are very pure, having an impurity concentration of less than 100 ppm by weight;

(b) during initial deposition of the layer, up to a thickness of about 5 to 20 nm, the mobility of the components on the substrate is reduced to promote germination; and (c) the components are subsequently deposited for the remainder of the layer up to the desired thickness, onto the substrate which is heated.

11 Claims, 1 Drawing Figure

DIAGRAM A

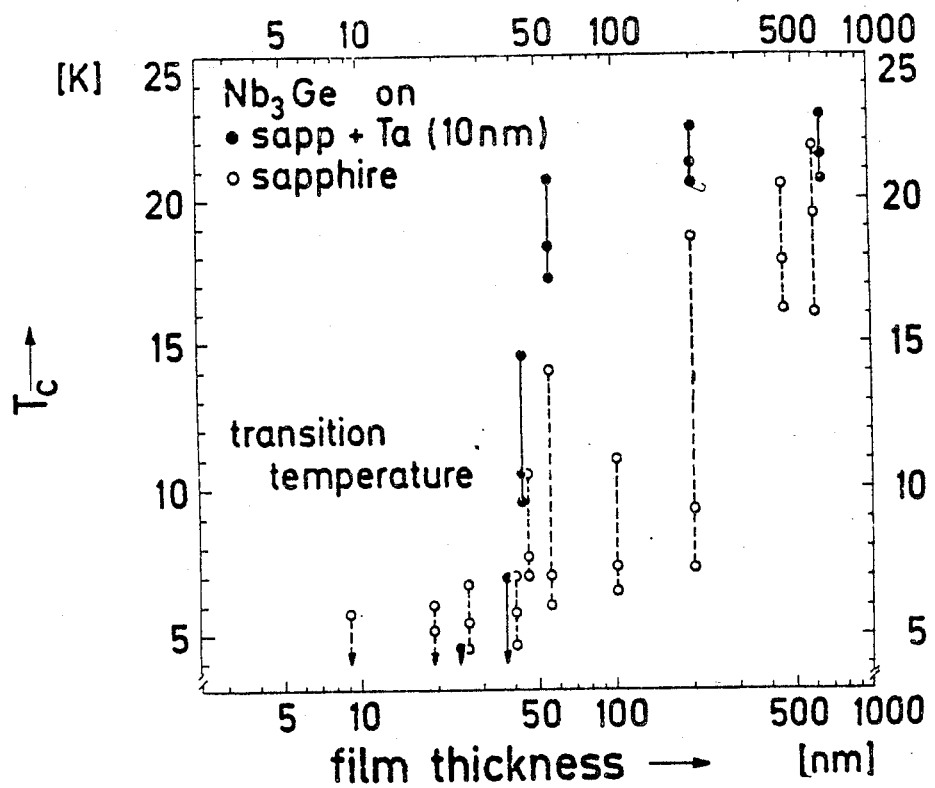
DIAGRAM A

PROCESS FOR THE PREPARATION OF SUPERCONDUCTING COMPOUND MATERIALS

CROSS REFERENCE TO RELATED APPLICATION

This application is a continuation application of copending application Ser. No. 06/432,377, filed Sept. 30, 1982, now abondoned which is a divisional of application Ser. No. 06/246,050 filed Mar. 20th, 1980, now U.S. Pat. No. 4,386,115.

BACKGROUND OF THE INVENTION

The present invention relates to a process for the preparation of superconducting compound materials formed of substrates and metallic layers of metastable or unstable phases strongly adhering to the surface of the substrates, the layers each containing more than one element and being deposited onto the substrate surfaces from a gas- or vapor-phase.

In known processes for the preparation of metallic layers of metastable or unstable stoichiometric compounds, especially phases with an A15 crystal structure, the elemental components of the compounds are condensed onto substrates which have already been heated to considerably high temperatures necessary for the formation of the metastable compounds. For example, in the preparation of the metastable A15 compound $Nb_3Ge$, niobium and germanium have been deposited on heated substrates, at a temperature of about 1073° K. In this way, with certain process conditions being observed, metastable phases with superconducting properties can be produced which exhibit a reproducible transition or critical temperature $T_c$ of about 21° K.

There have been many attempts to obtain very high transition temperatures, around 23° K. Indeed, on occasion, superconducting layers with transition temperatures between 22° and 23° K. have been obtained, but the preparation of these layers was not reproducible. It is suspected that the A15 phase responsible for the superconductivity would be stabilized by addition of impurities during the process of growth, but this assumption was not sufficient to understand the processes involved in the formation of, for example, a $Nb_3Ge$-phase, especially at the interface with the substrate.

It has been found that $Nb_3Ge$-films with a thickness of 100 nm or less, condensed onto a substrate surface by means of cathode sputtering, no longer show the maximum attainable transition temperature between 22° K. and 23° K., which has been measured in thicker films. See J. R. Gavaler et al, Applied Physics Letters, 33, No. 4, 1978, pp. 359 to 361. While in $Nb_3Ge$-films of a thickness less than 100 nm on sapphire substrates, transition temperatures ($T_c$) between 14° and 17° K. and unexpectedly large lattice parameters have been established, only smaller lattice parameters and transition temperatures of about 22° to 23° K. could be determined with increasing growth of the film thickness. After data from different laboratories became available, showing that the presence of impurities during the growth process of the A15 phase had a beneficial effect on the formation of stoichiometric high-$T_c$ $Nb_3Ge$, Gavaler et al investigated various substrates laminated with niobiumgermanium. These substrates have included sapphire, $A_2O_3$, Hastelloy B, foils of tantalum and vanadium and, in some cases, foils of tantalum and vanadium oxidized on their surface with air at 873° K. The following transition temperatures were found in these experiments:

$Nb_3Ge$ on pure Ta-substrate: $T_c$ about 13° K.
$Nb_3Ge$ on oxidized Ta-substrate: $T_c$ about 21.5° K.
$Nb_3Ge$ on vanadium-substrate: $T_c$ about 13° K.
$Nb_3Ge$ on $Al_2O_3$-substrate: $T_c$ about 22° K.

The yet unresolved difficulties with respect to the reproducibility in the production of A15 phases with high transition temperatures around 23° K., were also noted by R. E. Somekh, Philosophical Magazine B, Vol. 37, No. 6, pages 713 to 730. In this article, it was stated, that besides the influence of oxygen on the formation of the $Nb_3Ge$-phase, there are further parameters still to be properly identified.

SUMMARY OF THE INVENTION

It is an object of the present invention to provide a process by which metallic layers of metastable or unstable phases can be deposited onto the surfaces of substrates in a strongly adhering manner to produce materials with improved and reproducible physical properties, especially superconducting properties.

It is a further object of the present invention to enable the constant quality production of thin layer superconductors with an A15 structure and a high transition temperature, between 22° and 23° K., and above.

To achieve these objects and in accordance with its purpose, the present invention provides an improvement in a process for the preparation of a compound material composed of a substrate and a metallic layer of a metastable or unstable phase strongly adhering to the substrate surface, the layer containing more than one elemental component, and being deposited onto the substrate surface from a gas or vapor phase. The improvement includes the steps of:

(a) using components for formation of the metastable or unstable phase which are very pure, having an impurity concentration of less than 100 ppm by weight;

(b) during the initial deposition of the layer up to a thickness of about 5 to 20 nm, which is less the the desired final layer thickness, reducing the mobility of the layer components on the substrate to promote germination; and (c) subsequently, depositing the components for the remainder of the layer, up to the desired final thickness, onto the substrate which is heated.

The step of reducing the mobility of the layer components is preferably accomplished by any of three basic methods:

(1) The layer components may be deposited onto a cold substrate, at room temperature or below.

(2) A specific impurity which is oxygen or a gaseous oxygen-containing compound may be added to the components.

(3) The substrate may be coated with a heavy metal oxide layer, about 5 to 20 nm in thickness, prior to deposition of the components.

It is understood that both the foregoing general description and the following detailed description are exemplary, but are not restrictive of the invention.

DESCRIPTION OF THE PREFERRED EMBODIMENTS

The substrates used in the process of the present invention include those which have heretofore been used for the preparation of such superconducting compound materials. These include sapphire, aluminum oxide, Hastelloy B, foils of titanium and vanadium, and foils of titanium and vanadium oxidized on their surfaces at 873° K. Sapphire is preferred.

A metallic layer constituted by a metastable or unstable phase containing more than one elemental component is deposited on the substrate. It is required that the elemental components of the layer to be deposited on the substrate be of high purity, with an impurity concentration of less than 100 ppm, by weight. Further, during initial deposition of the layer, within a layer thickness of about 5 to 20 nm, the mobility of the components on the substrate surface must be reduced. This can be accomplished by using one or more of the methods to be discussed.

Mobility can be reduced by evaporating the component atoms onto a "cold" substrate. The temperature of the substrate will then be at or below room temperature, down to the temperature of liquid helium.

Alternatively, during initial layer formation, a specific impurity can be supplied to the components, the impurity being oxygen or an oxygen-containing compound, i.e. a gas which contains chemically combined oxygen, such as carbon dioxide. Oxygen or an oxygen-containing gas can be introduced by providing a partial pressure of the gas in the gas or vapor phase from which deposition is occurring. The partial pressure should be sufficient to deliver an amount of oxygen or oxygen-containing gas to the substrate which is comparable to the quantity of components being deposited, according to the evaporation rates of the components.

The amount of oxygen has the same order of magnitude as the delivered components.

When evaporation of the elemental components onto the substrate is accomplished by means of an electron beam evaporation process, the partial pressure of oxygen, when added, may be adjusted to $10^{-6}$ to $10^{-7}$ mbar in the reaction vessel. When a cathode sputtering method is used, which is well-known to include the use of inert gases, the oxygen or oxygen-containing gas is employed in a corresponding amount, with a partial pressure of $10^{-6}$ to $10^{-7}$ mbar.

A further method for reducing the mobility of the components on the substrate is to pre-coat the substrate, prior to the component coating, with a layer of a high-melting, heavy metal oxide, to a thickness of 5 to 20 nm. Examples of materials used for this purpose are chromium oxide and tantalum oxide.

With the reduction in mobility accomplished, the remainder of the layer is deposited on the substrate up to the desired thickness. For this deposition, the substrate will be heated, preferably to 1073° to 1273° K. The thickness of the superconducting layer depends on the special applications.

The present invention applies especially to the deposition of layers of $Nb_3Ge$ and $Nb_3Si$ in the A15 crystal phase/but also to the deposition of metastable metallic alloys consisting of at least two components.

In a preferred embodiment of the present invention, the reduction in mobility is accomplished by depositing the elemental components onto a cold substrate. This method phase but also to the deposition of metalstable metallic allows the preparation of an $Nb_3Ge$ layer without the possibility that impurities will be incorporated into the A15 phase by diffusion.

In a special embodiment of the present invention, highly purified niobium and highly pure germanium are deposited on a sapphire substrate from an ultra-high vacuum, no greater than $10^{-8}$ mbar residual partial pressure, by an electron beam evaporation or cathode sputtering process. The niobium and germanium are initially deposited in a 3:1 atomic ratio, on the substrate at or below room temperature, up to a layer thickness of 5 to 20 nm, in the form of a crystallographically highly distorted or amorphous layer.

Subsequently, the substrate is heated to a temperature between about 1073° and 1273° K., and the niobium and germanium are deposited under the same conditions as those set out immediately above, except for the temperature. An A15 phase of metastable $Nb_3Ge$ grows on the previously deposited layer, up to the desired final layer thickness.

It has been well known in the art that the presence of impurities, especially the presence of oxygen, during the process of layer growth, has a beneficial effect on the formation of $Nb_3Ge$. Since, generally, niobium contains a sufficient amount of the appropriate impurities, germination of the A15 phase is assured, and high transition temperatures, about 21° C., can be attained. To reach very high transition temperatures of about 23° K., however, the use of very pure raw materials is required, and the germination of the A15 phase is no longer assured.

It has now been found that the A15 phase grows out of an amorphous niobium-germanium layer, if the components have reduced mobility. It is this reduced mobility which the present invention seeks to achieve.

Under "very clean" conditions of layer generation, i.e. ultra-high vacuum in the range of $10^{-8}$ mbar, and use of materials with impurity concentrations less than 10 ppm, this amorphous layer—which can be produced by an electron beam evaporation process outside of the process of the present invention—does not form. Further, since the generation of the A15 phase usually occurs on a substrate at high temperatures (1073° to 1273° K.), the atoms evaporated onto the substrate surface have sufficient mobility to segregate, and thus to permit the formation of simple cubic phases, especially of niobium. Once such deposits of niobium have been formed, they may continue to grow epitaxially, and hinder the generation of the A15 phase. Such segregation at the beginning of the vaporization will result in the formation of an A15 phase with a low transition temperature, for example 14° K., and a low degree of order.

The preferred formation of a metastable A15 phase of the structure $A_3B$, compared with the thermodynamic equilibrium state, from an initially random mixture of A and B atoms, may be understood qualitatively by way of energy considerations. The thermodynamic equilibrium state of a system containing 75% A atoms and 25% B atoms, consists of two phases.

In the niobium-geranium case, there is the understoichiometric A15 phase and the $Nb_5Ge_3$ phase. In these cases, the formation of the metastable A15 phase $A_3B$ requires a lower activation energy than the two phase state, since the segregation energy (reordering by diffusion) as well as energy for the generation of interfaces between the phases must be increased for the formation of two phase mixture.

It is thereby essential that a homogeneous mixture of A and B atoms in the ratio of 3:1 be provided for the formation of a sufficiently thick, unordered initial layer. A constant condensation rate of the A and B atoms onto the substrate is necessary, but this in itself is not sufficient to produce the desired layer; the mobility of the atoms deposited onto the surface must also be reduced. It can be shown that crystallization from the amorphous state to the stoichiometric A15 phase occurs by the complete curing of amorphous niobium-germanium samples at 1123° K., the amorphous state being produced by evaporation onto substrates cooled with liquid nitrogen.

The combination of the evaporation of very pure components onto the substrate and the reduction of the mobility of the atoms deposited on the substrate, under the well-known conditions for the growth of A15 phases, assures reproducibility in the production of compound materials composed of substrates having metastable or unstable phases or layers which adhere strongly to the substrates.

The following examples are given by way of illustration to further explain the principles of the invention. These examples are merely illustrative and are not td be understood as limiting the scope and underlying principles of the invention in any way. All percentages referred to herein are by weight unless otherwise indicated.

EXAMPLE 1

A reaction vessel used for coating substrates consists of two evaporation sources, Nb and Ge crucibles, separated by a distance of about 20 cm. Parallel to their interconnection line, at a distance of about 50 cm above the crucibles, is mounted a heating band, on which 20 numbered substrates can be fixed in parallel with clamps.

The length of the heating band is 20 cm and the substrates were closely packed, (dimension of the sapphire 50×5×1 mm). The distance to each end of the heating-band was 5 cm.

Use of this arrangement leads to a variation of the Nb:Ge ratio in the layers deposited on the samples. Thus, substrates located in probe positions 8 to 12 will have the stoichiometric Nb:Ge ratio of 3:1. Below position No. 8, samples with an excess of Nb are obtained, and above position No. 12, samples with an excess of Ge are obtained. Evaporation from the crucibles by the electron beam method is controlled mass spectroscopically for constancy of rate.

As substrates, 20 samples of monocrystalline, randomly oriented sapphires of dimensions 50×5×1 mm were used, with the even numbered (No. 2,4,6 . . . ) substrates having been coated, by means of cathode sputtering, with a 15nm thick chromium layer, oxidized by atmospheric oxygen. The sapphire surfaces were brought to a temperature of 1123° K., measured by infrared spectroscopy, and the presssure inside the vessel was about $10^{-8}$ mbar. The electron beam evaporation from the crucibles, which contained materials of the highest purity, with less than 10 ppm impurities, was continued until a 200 nm thick Nb-Ge layer had formed on the substrates.

The simultaneous evaporation of Nb and Ge on the alternately arranged Cr-precoated and blank sapphire substrates resulted in the production of Cr-precoated substrates having transition temperatures up to 10° K. higher than the coated blank substrates. The Cr-precoated substrates also had smaller transition widths and higher resistance ratio r which is given by
$r = \rho(294° K.)/\rho(24° K.)$ $\rho$ = specific electric resistivity.

The noted properties are evidence of the preferred formation of the ordered, high transition temperature A15 phase $Nb_3Ge$ in the Cr - precoated samples. In those Cr-precoated samples having the stoichiometric 3:1 ratio of Nb to Ge, a transition temperature of 22.5° K. was achieved. The preparation of $Nb_3Ge$ with high purity materials (<10 ppm impurity concentration), without the application of the present invention for better phase growth of the A15 phase, leads to unreproducible values of $T_c$ and broad transition widths$\Delta T$, typical values are:

|  | $T_c \approx 19° K.$ thickness | $\Delta T_c \approx 10° K.$ $T_c[°K.]$ | $\Delta T[°K.]$ | r |
| --- | --- | --- | --- | --- |
| precoated sapphire | 200 nm | 22,5 | 2 | 2 reproducible |
| uncoated sapphire | 200 nm | 19 | 10 | 1,6 typical value |

EXAMPLE 2

The reaction vessel was set up as in Example 1. The sapphire substrates used were all uncoated (blank) and a diaphragm was mounted which could cover half the surface of each substrate.

During the preparation, each substrate was initially half covered. An approximately 5 nm thick $Nb_3Ge$ layer was then deposited on the uncovered substrate portions, with an oxygen partial pressure in the vessel of $7 \times 10^{-7}$ mbar. Subsequently, by closing the oxygen metering valve, the total pressure was lowered to $5 \times 10^{-8}$ mbar, and a further 2.5 nm $Nb_3Ge$ layer was deposited. Finally, the diaphragm was opened, and an approximately 80 nm thick $Nb_3Ge$ layer was deposited on the entire surface of each sapphire.

As a result of this procedure, at substrate position 9, corresponding to the stoichiometric 3:1 ratio of Nb:Ge in the coating composition, a transition temperature of 21.7° K. was achieved, in the portion with the initial addition of oxygen, despite the small layer thickness of 80 nm. The sapphire portions onto which $Nb_3Ge$ had been deposited without the initial addition of oxygen exhibited a maximum transition temperature of only 17.8° K., with a reduced resistance ratio, characteristic of the formation of foreign phases.

|  | $T_c[°K.]$ | $\Delta T[°K.]$ | r |
| --- | --- | --- | --- |
| half with initial oxygen | 21,5 | 3 | 1,7 |
| half without initial oxygen | 17 | 9 | 1,2 |

EXAMPLE 3

The reaction vessel was set up as in Example 1. Initially, the cold substrates were precoated with unordered, non-crystalline Nb-Ge by vapor deposition with the substrates at room temperature. The thickness of this layer was about 20 nm. Subsequently, the vapor deposition was continued while the temperature of the substrates was increased from 300° K. to 1123° K. An additional 80 nm layer was deposited in this step, 40nm thereof during this temperature increase, and 40 nm thereof at the optimum preparation temperature of 1123° K.

The stoichiometric sample exhibited a transition temperature of 22° K. with a resistance ratio of 1.5. A comparision with transition temperature values achieved on blank sapphire with the substrate temperature high from the beginning of the vapor deposition coating, as in Example 1, showed that a considerable improvement in the germination of the A15 phase had been achieved. The time for the temperature increase must be shorter than the time of decay of the desired metastable alloy.

EXAMPLE 4

The influence of raw material purity on transition temperature $T_c$ of $Nb_3Ge$ was investigated using the reaction vessel as set up in Example 1. The substrates were sapphires.

A layer thickness of 600 nm was used, since in this range, the remaining dependence of transition temperature on layer thickness is only a minor one. Using Nb and Ge with impurities less than 10 ppm, $T_c$ values of 23° K. for layers having a thickness equal to or greater than 600 nm could be achieved. If however, Nb with a Ta content of 900 ppm, measured by activation analysis, is used, Tc values of only 20.9° K. are obtained.

It will be understood that the above description of the present invention is susceptible to various modifications, changes and adaptions, and the same are intended to be comprehended within the meaning and range of equivalents of the appended claims.

What is claimed is:

1. In a process for the preparation of a composite material containing a substrate and a metallic layer of a metastable or unstable $Nb_6Ge$ phase strongly adhering to the substrate surface, and being deposited onto the substrate from the gas or vapor phase, the improvement comprising:
    (a) using very pure niobium and germanium components for formation of the metastable or unstable phase, having respective impurity concentrations of less than 100 ppm, by weight;
    (b) effecting an initial deposition of the layer to a layer thickness of about 5 to 20 nm by simultaneously depositing niobium and germanium on the substrate, while reducing the mobility of the components on the substrate to thereby promote germination of a subsequently deposited A15 $Nb_3Ge$ phase, the reduction of mobility being effected by coating the substrate surface, prior to initial deposition of the components, with a heavy metal oxide layer of chromium oxide; and
    (c) providing the substrate containing the intially deposited layer of the components with a temperature at which a metastable or unstable phase is formed and despositing the components up to a total layer thickness of no more than 200 nm, from the gas or vapor phase onto the substrate to produce the subsequently deposited A15 $Nb_3Ge$ phase.

2. Process according to claim 1 wherein said total layer thickness is about 80 nm.

3. Process according to claim 1, wherein said impurity concentrations are less than 10 ppm by weight.

4. Process according to claim 1, wherein the heavy metal oxide layer has a thickness of between 5 nm and 20 nm.

5. Process according to claim 1, wherein said depositions in step (b) and (c) are effected by physical vapor deposition.

6. Process according to claim 1, wherein the chromium oxide coating has a thickness of at least 5 nm.

7. In a process for the preparation of a composite material containing a substrate and a metallic layer of a metastable or unstable $Nb_3Ge$ phase strongly adhering to the substrate surface, and being deposited onto the substrate from the gas or vapor phase, the improvement comprising:
    (a) using very pure niobium and germanium components for formation of the metastable or unstable phase, having respective impurity concentrations of less than 100 ppm, by weight;
    (b) effecting an initial deposition of the layer to a layer thickness of about 5 to 20 nm by simultaneously depositing niobium and germanium by physical vapor deposition on the substrate while reducing the mobility of the components on the substrate to thereby promote germination of a subsequently deposited A15 $Nb_3Ge$ phase, the reduction of mobility being effected by coating the substrate surface, prior to initial depositing of the components, with a heavy metal oxide layer of tantalum oxide in a thickness of at least 5 nm and;
    (c) providing the substrate containing the initially deposited layer of the components with a temperature at which a metastable or unstable phase is formed and depositing by physical vapor deposition the components, from the gas or vapor phase onto the substrate to produce the subsequently deposited A15 $Nb_3Ge$ phase, said subsequently deposited A15 $Nb_3Ge$ phase having a $T_c$ of 22 to 23° K., and wherein the depositions of steps (b) and (c) are performed without using an oxygen impurity and wherein the total final combined thickness of the initially deposited layer of $Nb_3Ge$ and the subsequently deposited $Nb_3Ge$ layer added together is no more than 80 nm.

8. Process according to claim 7, wherein said impurity concentrations are less than 10 ppm by weight.

9. Process according to claim 7, wherein the physical vapor deposition of steps (b) and (c) is an evaporation.

10. Process according to claim 5, wherein the physical vapor deposition of steps (b) and (c) an evaporation.

11. The method as defined in claim 7, wherein the tantalum oxide layer has a thickness of between 5 nm and 20 nm.

* * * * *